(12) United States Patent
Balasubramaniam et al.

(10) Patent No.: US 7,700,494 B2
(45) Date of Patent: *Apr. 20, 2010

(54) LOW-PRESSURE REMOVAL OF PHOTORESIST AND ETCH RESIDUE

(75) Inventors: Vaidyanathan Balasubramaniam, Richardson, TX (US); Masaaki Hagihara, Peabody, MA (US); Eiichi Nishimura, Malden, MA (US); Koichiro Inazawa, Peabody, MA (US); Rie Inazawa, legal representative, Hokuto (JP)

(73) Assignee: Tokyo Electron Limited, Inc., Tokyo (JP)

( * ) Notice: Subject to any disclaimer, the term of this patent is extended or adjusted under 35 U.S.C. 154(b) by 1402 days.

This patent is subject to a terminal disclaimer.

(21) Appl. No.: 11/024,747

(22) Filed: Dec. 30, 2004

(65) Prior Publication Data

US 2006/0144817 A1    Jul. 6, 2006

(51) Int. Cl.
    *H01L 21/302* (2006.01)
(52) U.S. Cl. ................. 438/725; 438/706; 438/710; 216/63
(58) Field of Classification Search .......... 216/58, 216/59, 60, 63; 438/706, 710, 7, 712, 714, 438/725
    See application file for complete search history.

(56) References Cited

U.S. PATENT DOCUMENTS

| | | | |
|---|---|---|---|
| 4,844,775 A | 7/1989 | Keeble | 216/68 |
| 5,877,032 A * | 3/1999 | Guinn et al. | 438/9 |
| 6,040,248 A | 3/2000 | Chen et al. | |
| 6,057,247 A | 5/2000 | Imai et al. | 438/714 |
| 6,103,074 A | 8/2000 | Khominich | 204/192.38 |
| 6,168,726 B1 | 1/2001 | Li et al. | |
| 6,372,655 B2 | 4/2002 | Khan et al. | |

(Continued)

FOREIGN PATENT DOCUMENTS

TW    575676    2/2004

(Continued)

OTHER PUBLICATIONS

Hung et al., Patent Application No. US 2001/0008226 A1, published Jul. 19, 2001.

(Continued)

*Primary Examiner*—Lan Vinh
(74) *Attorney, Agent, or Firm*—Oblon, Spivak, McClelland, Maier & Neustadt, L.L.P.

(57) ABSTRACT

A method is provided for low-pressure plasma ashing to remove photoresist remnants and etch residues that are formed during preceding plasma etching of dielectric layers. The ashing method uses a two-step plasma process involving an oxygen-containing gas, where low or zero bias is applied to the substrate in the first cleaning step to remove significant amount of photoresist remnants and etch residues from the substrate, in addition to etching and removing detrimental fluoro-carbon residues from the chamber surfaces. An increased bias is applied to the substrate in the second cleaning step to remove the remains of the photoresist and etch residues from the substrate. A chamber pressure less than 20 mTorr is utilized in the second cleaning step. The two-step process reduces the memory effect commonly observed in conventional one-step ashing processes. A method of endpoint detection can be used to monitor the ashing process.

45 Claims, 10 Drawing Sheets

U.S. PATENT DOCUMENTS

| | | |
|---|---|---|
| 6,379,574 B1 * | 4/2002 | Ou-Yang et al. ............... 216/49 |
| 6,380,096 B2 | 4/2002 | Hung et al. |
| 6,406,836 B1 | 6/2002 | Mohondro et al. |
| 6,426,304 B1 | 7/2002 | Chien et al. |
| 6,440,864 B1 | 8/2002 | Kropewnicki et al. |
| 6,489,030 B1 | 12/2002 | Wu et al. |
| 6,491,042 B1 | 12/2002 | Young et al. ............... 134/1.1 |
| 6,492,222 B1 | 12/2002 | Xing |
| 6,536,449 B1 | 3/2003 | Ranft et al. |
| 6,551,447 B1 | 4/2003 | Savas et al. |
| 6,562,700 B1 | 5/2003 | Gu et al. |
| 6,605,863 B2 | 8/2003 | Yin et al. |
| 6,680,516 B1 | 1/2004 | Blosse et al. |
| 6,815,362 B1 | 11/2004 | Wong et al. ................ 438/706 |
| 6,831,018 B2 | 12/2004 | Kanegae ..................... 438/706 |
| 6,962,883 B2 | 11/2005 | Nag et al. ................... 438/788 |
| 7,169,440 B2 * | 1/2007 | Balasubramaniam et al. ........................ 427/162 |
| 2003/0040192 A1 * | 2/2003 | Kanegae ..................... 438/710 |
| 2003/0192856 A1 | 10/2003 | Balasubramaniam et al. |
| 2003/0194876 A1 | 10/2003 | Balasubramaniam et al. ........................ 438/725 |
| 2004/0104358 A1 | 6/2004 | Moroz |
| 2004/0171273 A1 | 9/2004 | Oyama et al. |

FOREIGN PATENT DOCUMENTS

| | | |
|---|---|---|
| TW | 200425247 | 11/2004 |
| WO | WO 99/50886 | 10/1999 |
| WO | WO 00/26954 A1 | 5/2000 |

OTHER PUBLICATIONS

Sukuki, Patent Application Publication No. US 2001/0006849 A1, published Jul. 5, 2001.

Balasubramaniam et al., Patent Aplication Publication No. US 2003/0194876, published Oct. 2003.

* cited by examiner

LOW-PRESSURE REMOVAL OF PHOTORESIST AND ETCH RESIDUE

CROSS-REFERENCE TO RELATED APPLICATIONS

The present application is related to U.S. patent application Ser. No. 10/259,768, filed on Sep. 30, 2002 now U.S. Pat. No. 7,169,440, the entire contents of which is herein incorporated by reference. The present application is related to copending United States patent application entitled "LOW-PRESSURE REMOVAL OF PHOTORESIST AND ETCH RESIDUE", filed on Sep. 30, 2002, the entire contents of which is herein incorporated by reference.

FIELD OF THE INVENTION

The present invention is related to plasma processing, particularly to cleaning and removal of photoresist and etch residues following an etch process in semiconductor microfabrication.

BACKGROUND OF THE INVENTION

Plasma processing systems are used in the manufacture and processing of semiconductors, integrated circuits, displays, and other devices or materials to both remove material from or to deposit material on a substrate such as a semiconductor substrate. Plasma processing of semiconductor substrates to transfer a pattern of an integrated circuit from the photolithographic mask to the substrate, or to deposit dielectric or conductive films on the substrate, have become standard methods in the industry.

In semiconductor processing, where various types of films are etched, integration challenges and trade-offs still remain. Conventionally, a dielectric layer is patterned with openings for depositing conductive materials to form vertical contacts. During the patterning process, etch resistant photoresist layer and/or a hard mask layer is deposited over the dielectric layer, exposed to a selected pattern and developed. The layered structure is then etched in a plasma environment where the patterned photoresist layer defines openings in the dielectric layer.

Following the etch step, photoresist remnants and etch residues (e.g., polymer debris) are frequently observed on the etched features and chamber surfaces. One of the integration challenges in plasma cleaning (also known as in-situ ashing), is to successfully remove photoresist remnants and etch residues, while avoiding erosion of surrounding layers. Known systems have used a one-step ashing process in which the bias applied to the substrate is maintained constant throughout the ashing process.

Halocarbon gases are commonly used in the etching of dielectric layers, such as oxides and newer SiOC-containing low-k dielectric materials. These gases are known to generate fluoro-carbon polymer etch products, that can deposit on the internal surfaces of the processing chamber, as well as on the substrate surface, during the dielectric etch process.

FIG. 1 shows an exemplary cross-sectional representation of a one-step ashing process. During a conventional one-step ash process for removing photoresist 106 from structure 100, fluoro-carbon polymers are released/etched from the chamber walls (commonly referred to as a memory effect) and can attack underlying dielectric layer 104 and cap layer 102 (e.g., SiN, SiC), leading towards faceting 108 of the dielectric layer and cap layer loss 110, sometimes even punching through the cap layer 102 and attacking the underlying conductive layer (e.g., copper). This effect can be very high at the edges of a wafer due to high fluoro-carbon polymer concentration near the chamber walls. Alternatively, the structure 100 can also contain fluoro-carbon polymer deposits.

During a conventional one-step ash process, photoresist can be removed in an oxygen-containing plasma. To avoid post-ash residue formation, some bias power is applied to the substrate holder. During this process, the fluoro-carbon deposits on the chamber walls from the preceding dielectric etch are also etched, releasing fluorine radicals in the plasma. As bias is applied to the substrate holder, these fluorine radicals can erode the underlying dielectric film and consume the cap layer. By reducing the bias or applying zero bias, dielectric film erosion and cap layer consumption can be reduced but post-ash residue can still be observed.

A conventional one-step ash process, that can result in the above chamber problems, can involve the following plasma process conditions: Chamber pressure=50 mTorr, RF bias=150 W, $O_2$ flow rate=200 sccm.

In semiconductor manufacturing, the conventional one-step ash process is frequently carried out in a processing chamber where the internal chamber surfaces (and the substrate to be ashed) can contain fluoro-carbon-based polymer deposits from a preceding dielectric etch process. Alternatively, the one-step ash process can be carried out in a processing chamber that has been cleaned of polymer deposits from a prior etch process.

SUMMARY OF THE INVENTION

It is an object of the invention to provide a plasma processing method for removing photoresist remnants and etch residues from a substrate with reduced erosion of the surrounding substrate layers compared to one-step ashing.

The above and other objectives are accomplished using a two-step in-situ plasma ashing process utilizing a process gas comprising an oxygen-containing gas. During the first ashing step, a first low or zero bias level is applied to the substrate holder upon which a substrate resides, while a second bias level is applied during the second ashing step. The pressure in the plasma processing chamber in the second ashing step is less than 20 mTorr.

During the first ashing step, where low or zero bias is applied to the substrate, a significant amount of photoresist remnants and etch residues on the substrate and internal surfaces/walls of the processing chamber are etched and removed from the chamber, while erosion of the remaining substrate layers is minimized. During the second ashing step, an increased bias is applied and the ashing process is continued until the photoresist remnants and etch residues are removed.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS OF INVENTION

The inventors of related U.S. patent application Ser. No. 10/259,768, entitled LOW-PRESSURE METHOD FOR REMOVING PHOTORESIST AND ETCH RESIDUE, which are the inventors of the present application, realized that a two-step plasma ashing process can be utilized to remove photoresist remnants and etch residues from a substrate. During the first ashing step, where zero or low bias is applied to a substrate holder upon which a substrate resides, a significant amount of photoresist remnants and etch residues, from preceding etch processes that can, for example, utilize $C_xF_y$ etch gases, are etched and removed from the processing chamber with minimal erosion of the remaining substrate layers. During the second ashing step, an increased bias is applied to the substrate holder and the ashing process is continued until the photoresist and/or hard mask remnants, and post-ash residues are removed.

The current inventors have realized that if the above-mentioned second ashing step is performed at a very low pressure (less than 20 mTorr) in the plasma processing chamber, the process can reduce or eliminate detrimental oxidation of underlying dielectric substrate layers, for example low dielectric constant (low-k) materials such as SiOC materials (k~2.7). The reduced oxidation has been attributed to lower concentration of oxygen-containing radicals in the plasma environment at low processing chamber pressure.

Figure 6B:
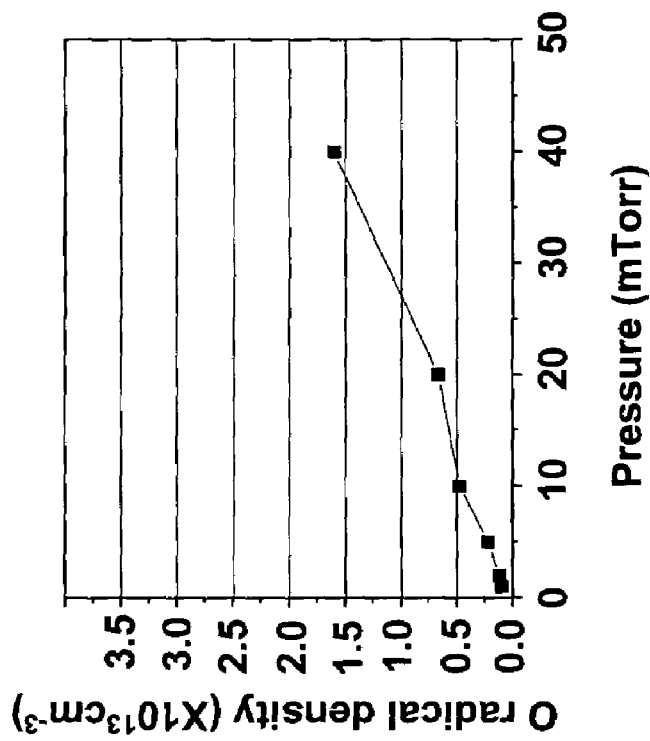
FIG. 6B shows O radical density in a plasma as a function of chamber pressure.
Figure 6A:
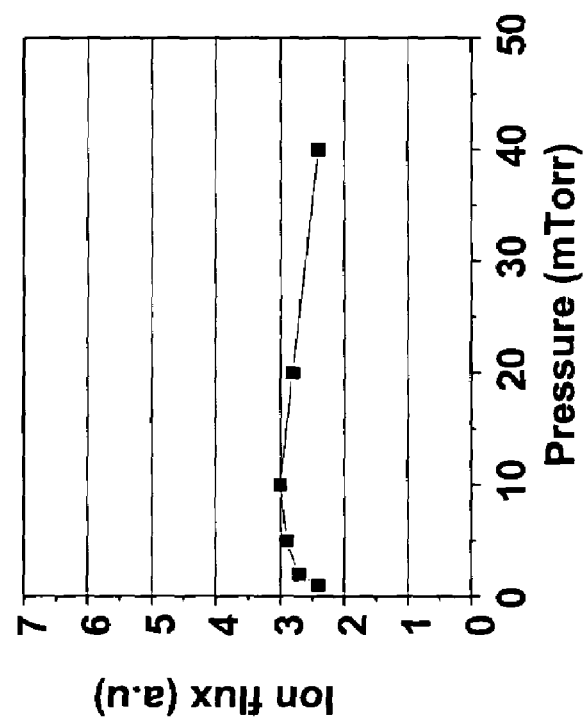
FIG. 6A shows ion flux measured on a substrate as a function of chamber pressure.
Figure 7:
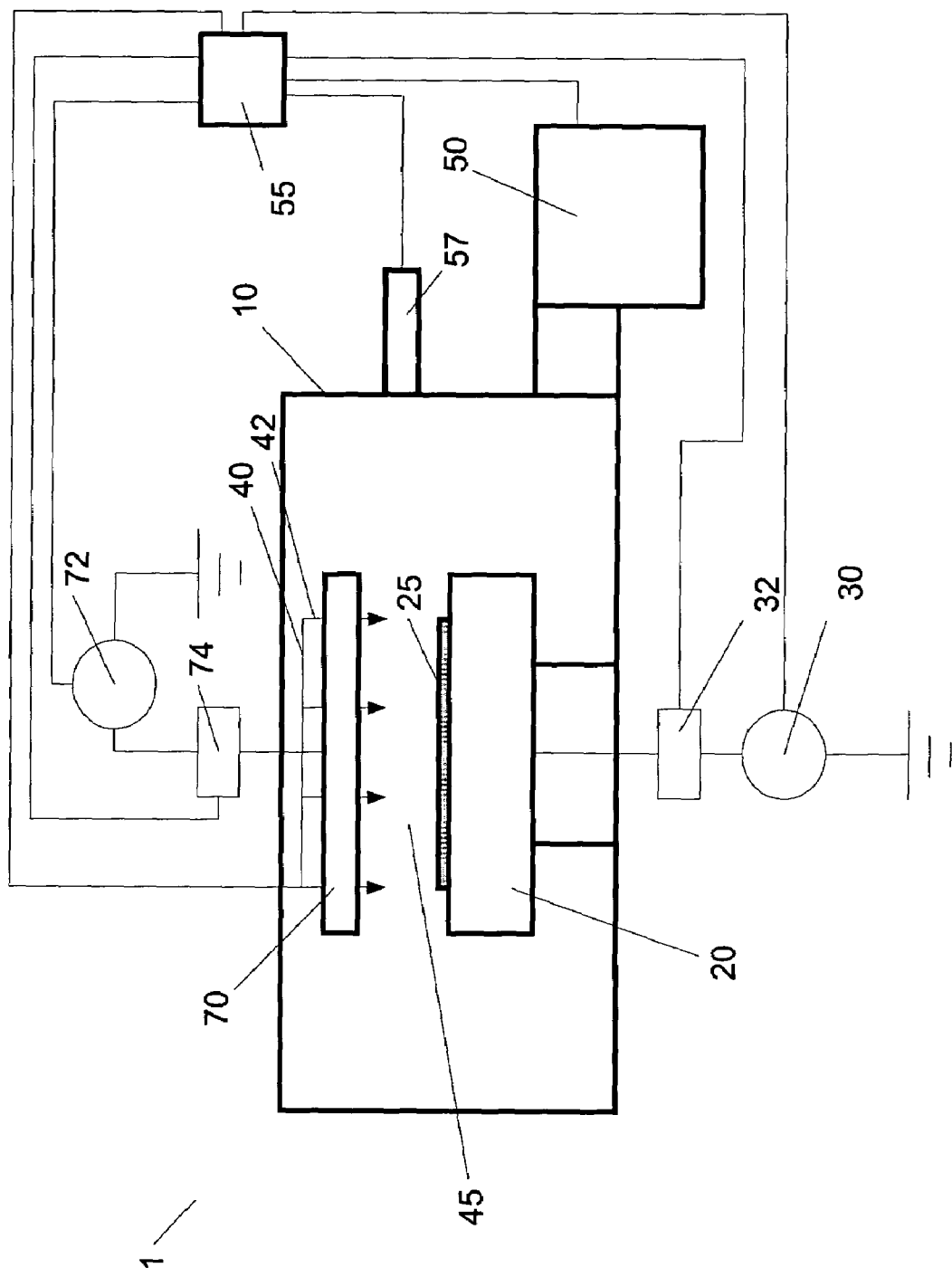
FIG. 7 shows a plasma processing system according to an embodiment of the present invention.

FIG. 6A shows ion flux measured on a substrate as a function of chamber pressure. The plasma processing system contained a capacitively coupled plasma source and a process gas containing $O_2$ and Ar was used. FIG. 7 shows an exemplary plasma processing system containing a capacitively coupled plasma source. FIG. 6A shows that the ion flux is relatively constant over the pressure range shown. High ion flux enables high ashing rate and short ashing time. In addition, lowering the chamber pressure results in more directional (anisotropic) ion bombardment of the substrate layers, thereby reducing the damage to sidewalls of patterned dielectric layers during an ash process.

FIG. 6B shows O radical density in a plasma as a function of chamber pressure. FIG. 6B shows that concentration of O radicals in the plasma decreases with decreasing chamber pressure. Oxidation of low-k materials has been observed to increase the dielectric constants of the low-k materials, thereby reducing the advantage of using these materials over conventional higher dielectric constant materials (e.g., $SiO_2$, k~3.9).

Thus, according to an embodiment of the invention, a process pressure less than 20 mTorr is utilized in the processing chamber during the second ashing step of the two-step ashing process. According to another embodiment of the invention, a process pressure less than about 10 mTorr can be utilized in the processing chamber during the second ashing step.

A two-step in-situ ash process according to the current invention can alleviate many of the above shortcomings by satisfying at least one of: 1) minimizing cap layer consumption; 2) minimizing dielectric faceting/erosion at the top of features, and reducing post-etch/critical-dimension (CD) bias; 3) minimizing post-ash residues; 4) minimizing damage (increase in "k" value) induced to low-k dielectric films during in-situ ash; and 5) providing automatic chamber dry cleaning, thereby increasing mean-time-between-chamber-cleaning.

Figure 1:
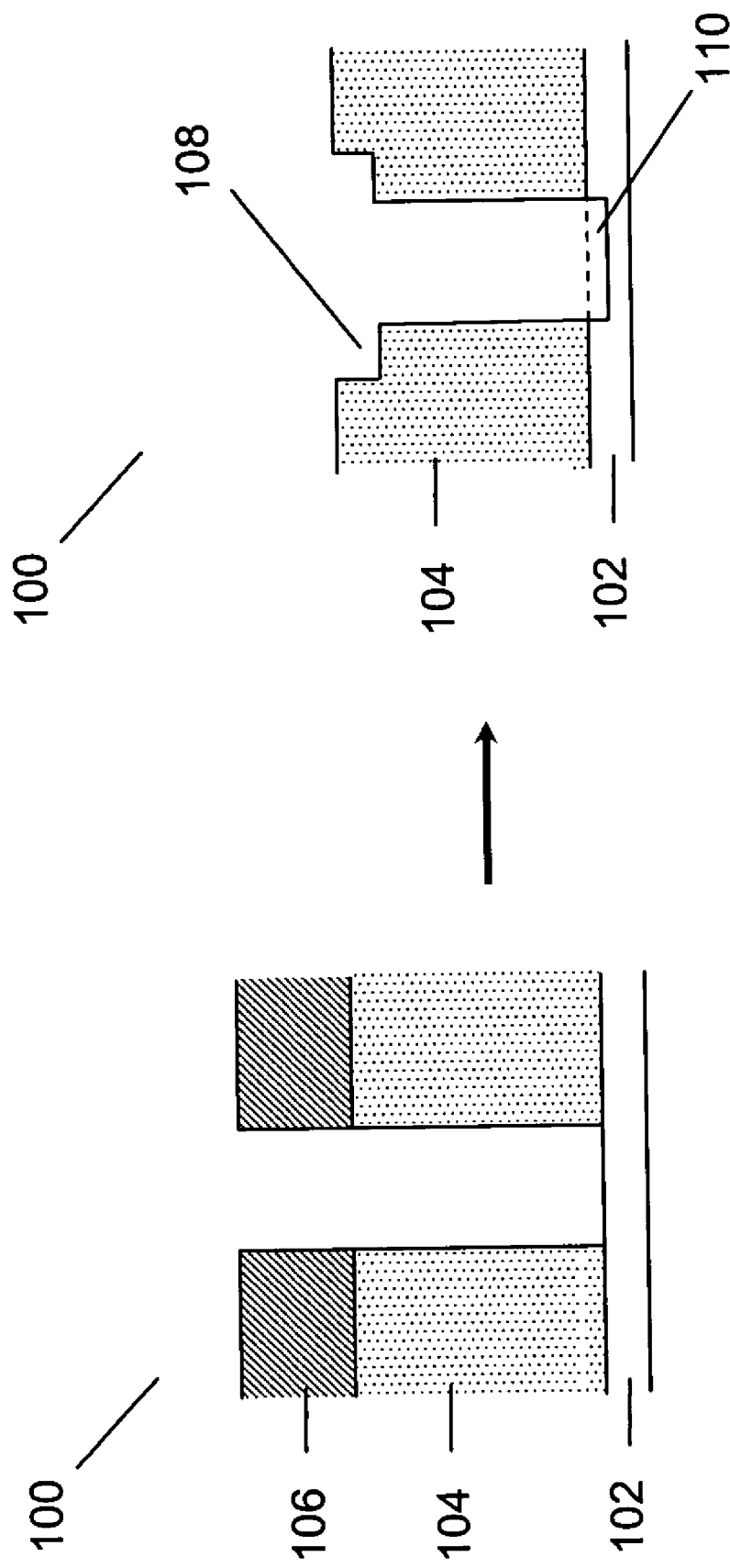
FIG. 1 shows an exemplary cross-sectional representation of a one-step ashing process.
Figure 2:
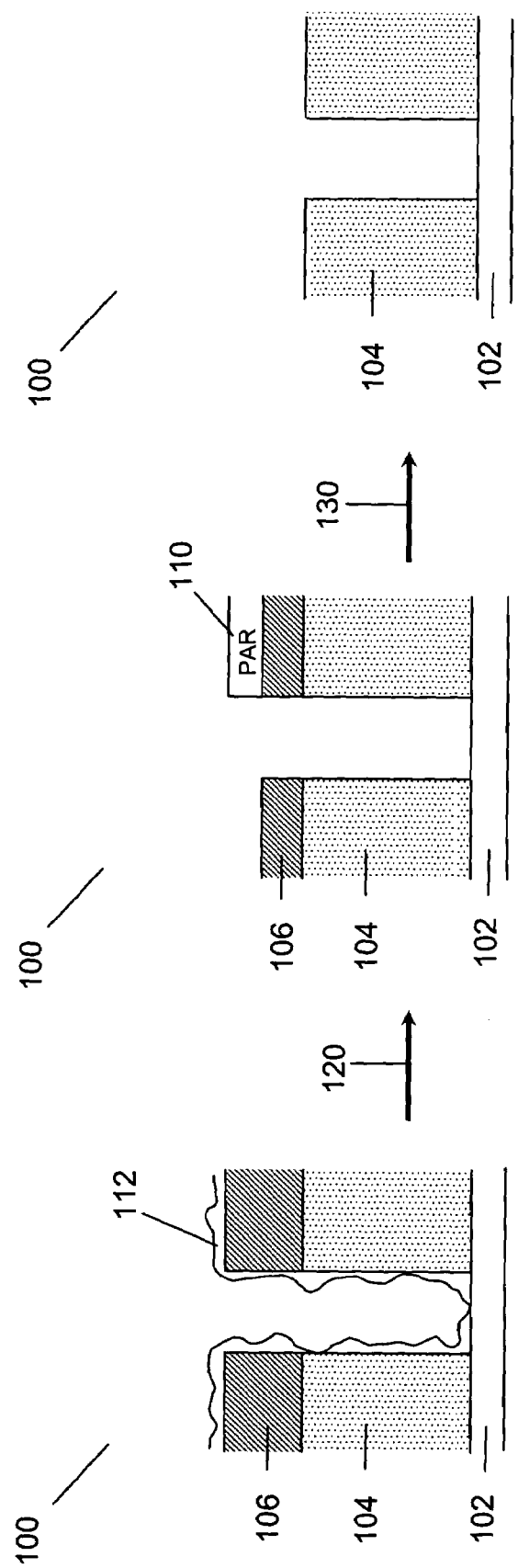
FIG. 2 shows an exemplary cross-sectional representation of a two-step ashing process.

FIG. 2 shows an exemplary cross-sectional representation of a two-step ashing process. During the first ashing step 120, of a two-step oxygen ash process, the photoresist 106 on the wafer, and fluoro-carbon polymers 112 deposited on the chamber walls (not shown) and wafer are etched. As zero or low bias is applied, erosion of the dielectric layer 104 and consumption of the cap layer 102 are minimized. During the first ashing step 120, the chamber is dry cleaned of any polymer residues. The length of the first ashing step 120 can be based on time and can leave a small amount of post-ash residue 110 and possibly a small amount of photoresist 106 on the substrate.

During the second ashing step 130, bias is applied, and the ashing is carried out for a time sufficient to remove any post-ash residue 110 and any remaining photoresist 106.

The current invention can, for example, be carried out using a plasma processing system containing a capacitively coupled plasma source having an upper electrode and a lower electrode. The upper electrode can, for example, further function as a showerhead for introducing a process gas into the processing chamber, and the lower electrode can be a substrate holder configured for supporting a substrate to be processed and for applying a bias to the substrate. Capacitively coupled plasma sources are well known to persons skilled in the art. The current invention can also be carried out using other types of plasma sources including, for example, an inductive coupling plasma source (ICP).

Exemplary process parameters for the first ashing step of the two-step ashing process according to embodiments of the current invention will now be described. In one embodiment of the invention, the chamber pressure can be between about 1 mTorr and about 1000 mTorr. According to another embodiment of the invention, the chamber pressure can be between about 5 mTorr and about 50 mTorr. A process gas flow rate of about 5 sccm to about 1500 sccm can be used in the processing chamber. A process gas containing an oxygen-containing gas (e.g., $O_2$) can be used alone, but it may also be used in conjunction with an inert gas (e.g., a noble gas (He, Ar, etc.) or $N_2$). The flow rate of the oxygen-containing gas can, for example, be between about 5 sccm and about 500 sccm and the flow rate of the inert gas can, for example, be between about 0 sccm and about 1000 sccm. A bias power (lower electrode power) can, for example, be between about 0 W and about 100 W, an upper electrode power, can for example, between about 500 W and about 2200 W, and the substrate temperature can be between about −10° C. and about 250° C.

In one example, the process parameters for the first ashing step includes a chamber pressure of 20 mTorr, an Ar flow rate of 550 sccm, an $O_2$ flow rate of 200 sccm, an upper electrode power of 300 W, and a lower electrode power of 0 W. The time duration of the first ashing step can, for example, be about 35 sec.

In the second ashing step of the two-step ashing process, the process parameter space can include the same conditions described above for the first ashing step, except that the chamber pressure in the second ashing step is less than 20 mTorr. In an embodiment of the invention, the chamber pressure in the second ashing step can be less than about 10 mTorr. In another embodiment of the invention, the chamber pressure in the second ashing step can be less than about 5 mTorr. A bias between about 50 W and about 1000 W can be used, where the bias applied to the substrate holder in the second ashing step (second bias) is greater than the bias applied to the substrate holder in the first ashing step (first bias).

Although a RF bias is disclosed as being used, a DC bias may also be used or may be used instead of a RF bias. Additionally, chamber pressure can be varied during the ashing process. For example, the chamber pressure can be varied from the first step to the second step. Furthermore, the composition of the process gas can be varied during the ashing process. For example, the process gas (and flow ratios of different gases in the process gas) can be varied from the first step to the second step.

In one example, 200 mm silicon wafers were processed. The process parameters during the second ashing step included a chamber pressure of 10 mTorr, an upper electrode power of 300 W, a lower electrode power of 300 W, an $O_2$ gas flow rate of 300 sccm (without using an inert gas), and a substrate temperature of 50° C. The substrate was exposed to the plasma environment for 35 sec in the second ashing step.

In another example, 300 mm silicon wafers were processed. The process parameters during the second ashing step included a chamber pressure of 15 mTorr, an upper electrode power of 300 W, a lower electrode power of 400 W, an $O_2$ gas flow rate of 400 sccm (without using an inert gas), and a substrate temperature of 50° C. The substrate was exposed to the plasma environment for 35 sec in the second ashing step.

Alternatively, during the two-step process, a bias can be applied when substantially all (but not all) of the polymer has been removed from the chamber in order to increase throughput, but at a cost of reintroducing some of the effects of the conventional one-step process.

Furthermore, although described above as using only a single bias, a varying bias can be used instead. For example, the bias may be increased (either continuously or stepwise) before, during, or after the second step.

As described above, the time duration for the first step should be sufficiently long to complete the removal of fluorocarbon material from the chamber walls and wafer surface. For example, the time duration for the first step can range from 10 sec to 100 sec. In another example, the time duration for the first step ranges from 20 to 50 sec. Similarly, the time duration for the second step should be sufficiently long to remove any post-ash residue and any remaining photoresist. For example, the time duration for the second step can range from 10 sec to 100 sec. In another example, the time duration for the second step ranges from 20 to 50 sec.

Alternatively, in the two-step ashing process in FIG. 2, the end of the first step 120 and the second step 130 can be determined using endpoint detection. One possible method of endpoint detection is to monitor a portion of the emitted light spectrum from the plasma region that indicates when all (or substantially all) of the polymer (and possibly the photoresist) has been removed from the chamber. For example, portions of the spectrum that indicate such a removal have wavelengths of 482.5 nm (CO), 775.5 nm (F), and 440 nm ($SiF_4$), and can be measured using Optical Emission Spectroscopy (OES). After emission levels corresponding to those frequencies cross a specified threshold (e.g., drop to substantially zero or increase above a particular level), the first step is considered to be complete. Other wavelengths that provide endpoint information can also be used.

After the end of the first step, the second step preferably utilizes a 50-200% overash to remove any remaining post-ash residue (PAR). That is, if the first step is completed in 50 sec, the second step would be 25 sec for a 50% overash and 50 sec for a 100% overash. The actual amount of overash can be determined empirically by examining a series of substrates that are overashed to different degrees.

Figure 3:
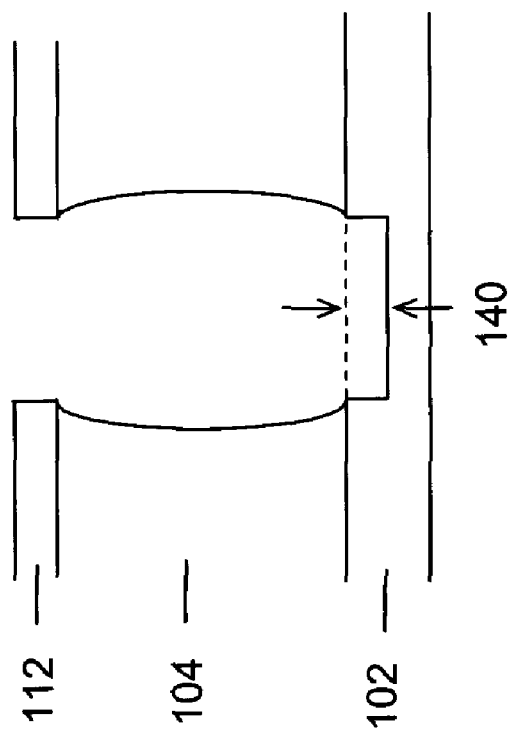
FIG. 3 schematically shows loss of a cap layer during an ash process.

FIG. 3 schematically shows loss of cap layer 102 during an ash process. Cap layer loss 140 is measured as the thinning of a cap layer in a scanning electron micrograph (SEM) image, following an ash process. Cap layer loss 140 for three ash processes was described in co-pending U.S. patent application Ser. No. 10/259,768, filed on Sep. 30, 2002. The three ash processes were: a) two-step ash in a chamber with polymer deposits (zero bias in the first step, increased bias in the second step); b) conventional one-step ash in a clean chamber; and c) conventional one-step ash in a chamber with polymer deposits. The process conditions in these ash processes were:

a) First ash step: Chamber pressure=50 mTorr, RF bias =0 W, $O_2$ flow 200 sccm, Second ash step: Chamber pressure=20 mTorr, RF bias=150 W, $O_2$ flow=20 sccm, Ar/$O_2$ flows=200/20 sccm;

b) Chamber pressure=50 mTorr, RF bias=150 W, $O_2$ flow 200 sccm; and c) Chamber pressure=50 mTorr, RF bias=150 W, $O_2$ flow 200 sccm.

A reduced cap layer loss 140 is observed in the above two-step ash process (a), when compared to the one-step ash processes (b) and c)). For example, the cap layer loss decreases in the order c)>b)>a), as shown in TABLE 1. As a result, the two-step process provides an ash method that minimizes cap layer loss. The two-step process a) utilized a chamber pressure of 20 mTorr. However, it is believed that a chamber pressure less than 20 mTorr in the current invention further reduces cap layer loss.

TABLE 1

| Ash process | Cap layer loss (nm) | |
|---|---|---|
| | Wafer Center | Wafer Edge |
| a | 18 | 18 |
| b | 24 | 24 |
| c | 36 | 36 |

Figure 4A:
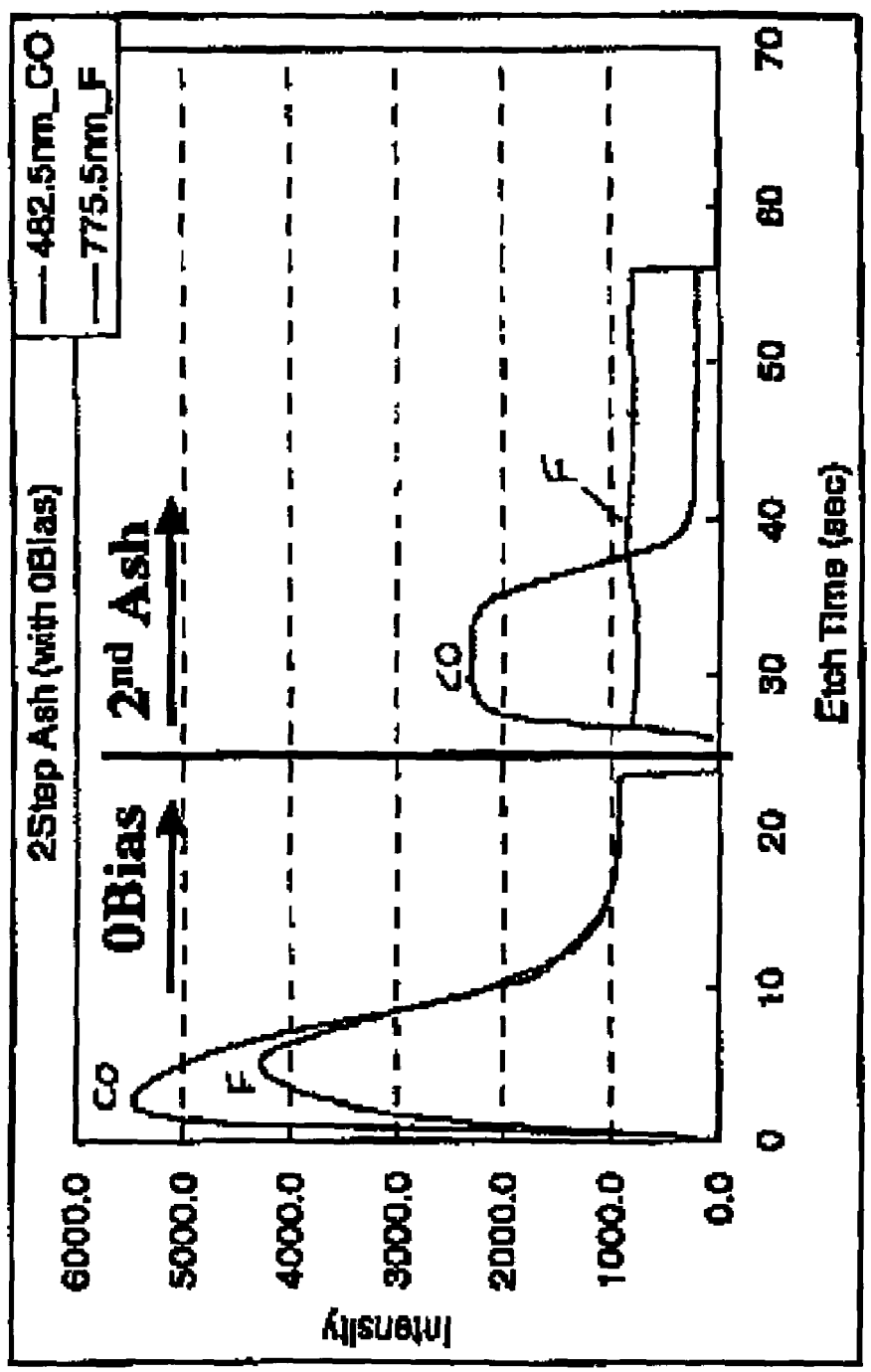
FIGS. 4A-4C show Optical Emission Spectroscopy (OES) graphs of ash processes.
Figure 4B:
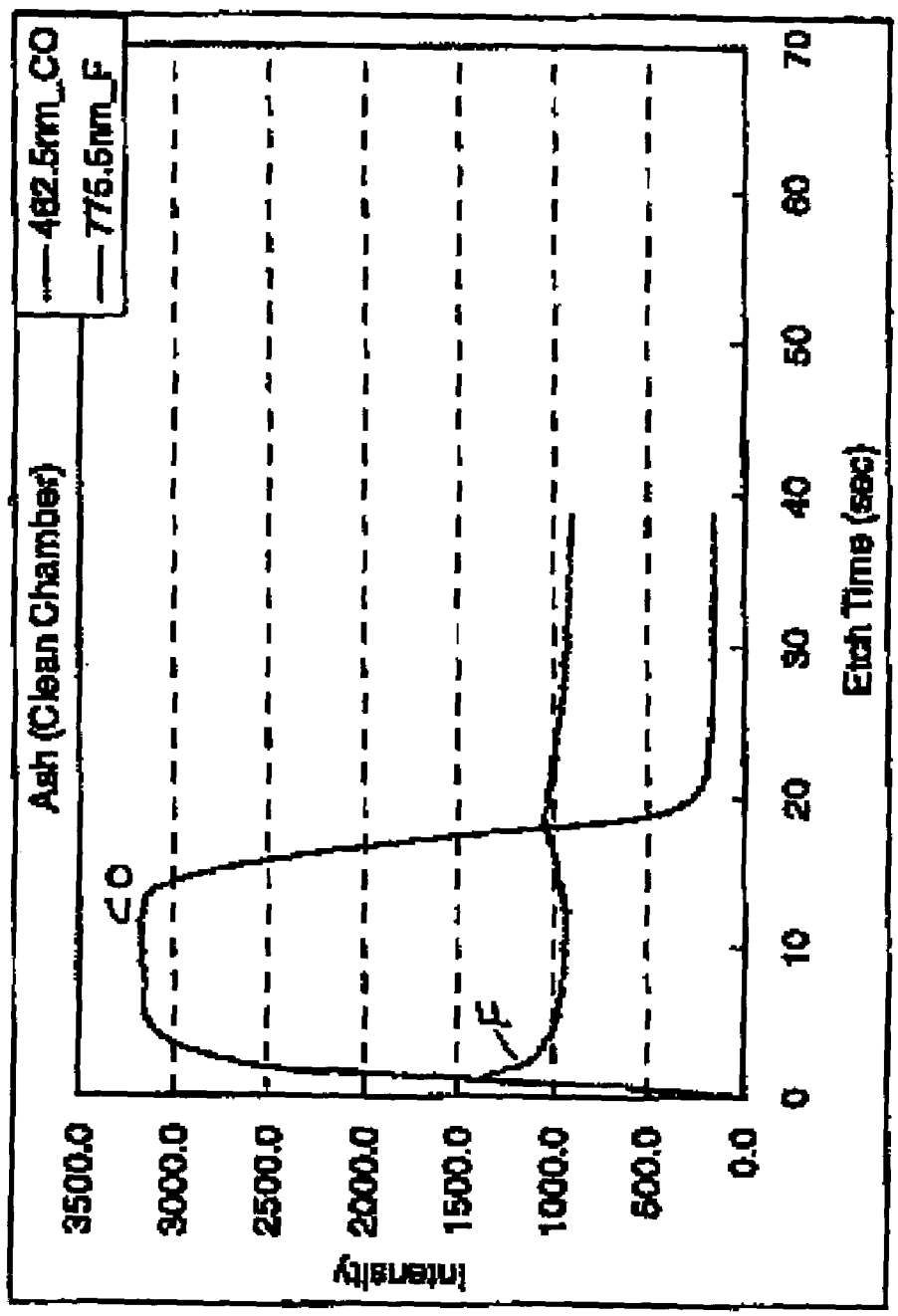
Figure 4C:
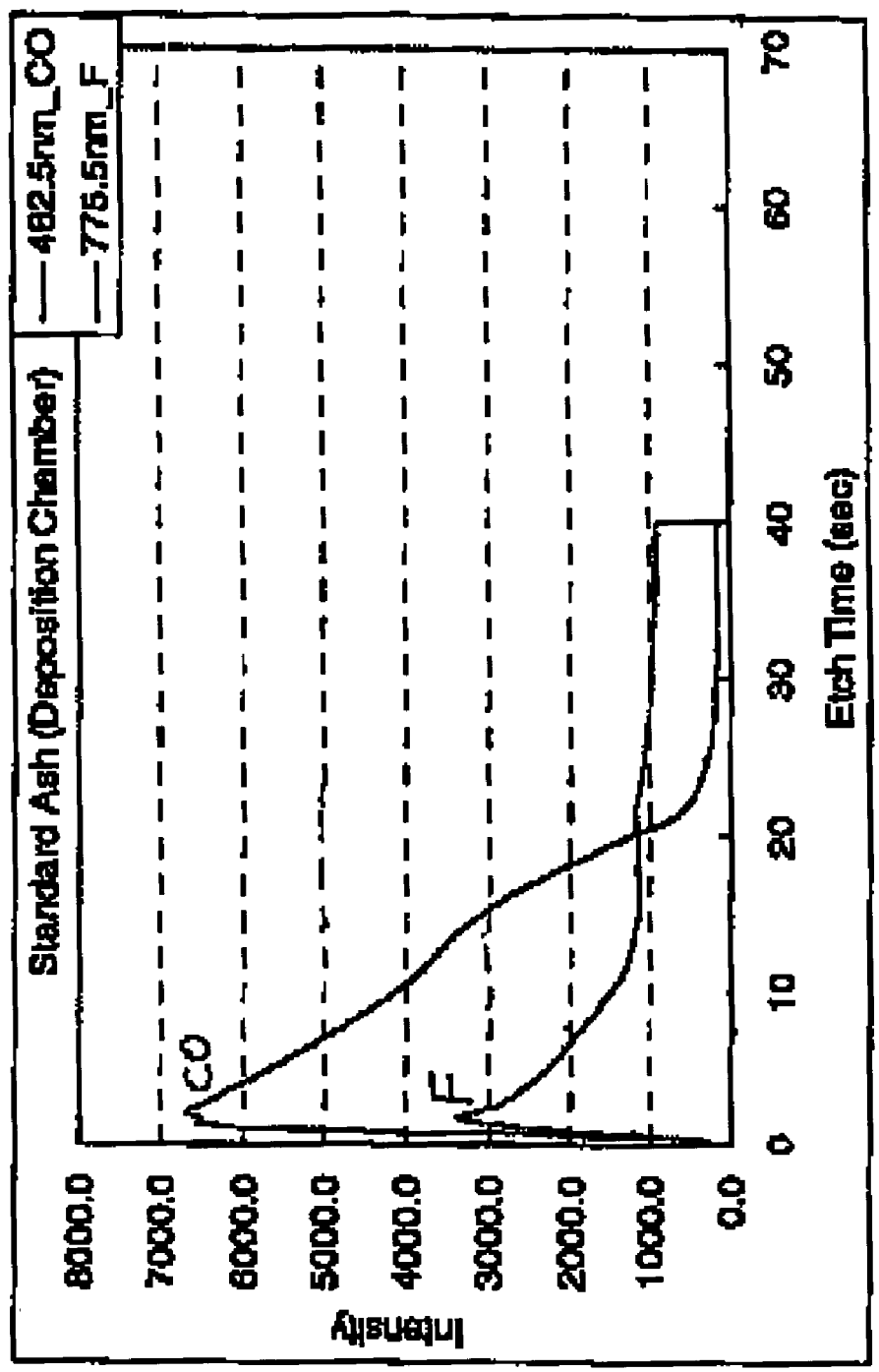

FIGS. 4A-4C show OES graphs of ash processes. The release of fluoro-carbon polymers from surfaces in the chamber (including the substrate surfaces) during the above processes can be monitored using OES. The OES graphs in FIGS. 4A-4C, correspond to the abovementioned a)-c) ash processes, respectively. In FIG. 4A, a two-step ash process is carried out while monitoring emitted light signals that correspond to CO (482.5 nm) and F (775.5 nm) species. After an initial maximum intensity in the CO and F signals during the first ash step (zero bias applied), the two signals decrease monotonically thereafter, and show relatively low levels of CO and F species at the end of the first ash step. During the second ash step (bias applied), a low F signal level is maintained, but the CO signal shows a maximum intensity before reaching a new low level that is maintained for the remainder of the ash process. Importantly, the OES graph in FIG. 4A, shows that relatively low levels of CO and F species are reached before the end of the first ash step. Therefore, the F and CO signals (and/or other OES signals) can used to determine the end of the first ash step. The end of the second ash step in FIG. 4A can also be determined from the CO signal (and/or other OES signals).

FIG. 4B shows an OES graph during a conventional one-step ash process in a clean chamber. FIG. 4C shows an OES graph during a conventional one-step ash process in a chamber with polymer deposits. Large CO and F signals show high levels of these species during the ash process in the presence of a bias. Significantly reduced levels of CO and F are observed in FIG. 4B compared to FIG. 4C, but higher levels of CO and F are observed in FIG. 4C with bias on when compared to the first step of FIG. 4A when the bias is off.

Importantly, FIGS. 4A-4C illustrate that OES can be utilized to monitor the presence of a plasma species (e.g., F) that is detrimental to the ash process and can result in faceting of the dielectric layer and cap layer loss. Furthermore, OES can be utilized to determine the end of a plasma period where detrimental species are present in significant amounts in the plasma environment.

Damage to sidewalls of a dielectric layer that occurs during an ash process, is critical in semiconductor manufacturing. Following a plasma ash, the damage can be evaluated by measuring dielectric sidewall loss due to exposure to a HF etching solution.

Figure 5:
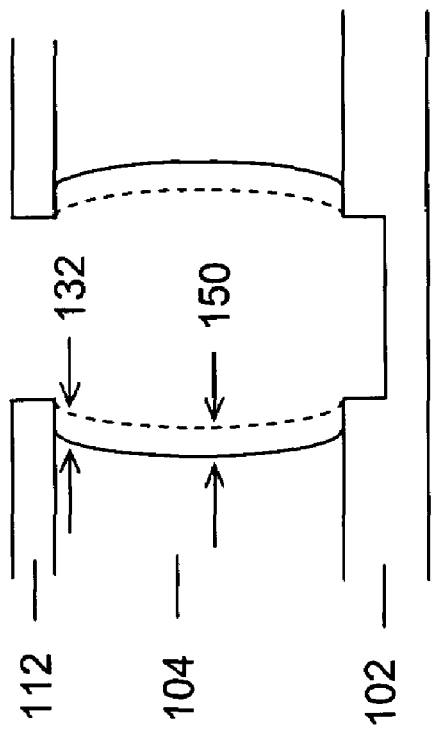
FIG. 5 schematically shows dielectric sidewall loss.

FIG. 5 schematically shows dielectric sidewall loss. The dielectric sidewall loss in FIG. 5 is measured as removal at the top 132 and middle 150 of the dielectric layer 104 after exposure to a HF solution. The test structure in FIG. 5 further contained a SiN layer 112 and a SiC layer 102. The dielectric sidewall loss was measured using each of the three above-mentioned ash processes (a)-c), and in addition, using a d) two-step ash process at a lower total chamber pressure, and higher $O_2$ flow than the first ash step in process a).

The process conditions in ash process d) were: First ash step: Chamber pressure=20 mTorr, RF bias=0 W, $O_2$ flow 500 sccm; Second ash step: Chamber pressure=20 mTorr, RF bias=150 W, $O_2$ flow 20 sccm, Ar/$O_2$ flows=200/20 sccm.

The plasma ashed substrates were exposed to a 0.5% HF solution for 5 sec to 30 sec. SEM analysis of sidewall loss for a 30 sec HF exposure is shown in TABLE 2 for ashing processes a)-d). In summary, the dielectric sidewall loss (and therefore sidewall damage during the ash process) is less for the two-step ash process d) (where a lower chamber pressure and higher $O_2$ flow are utilized), than the two-step process a). In addition, the one-step process b), which was carried out in a clean chamber, shows less dielectric sidewall loss than one-step process c) and two-step process a), that were both carried out in chambers with polymer deposits.

TABLE 2

| Ash process | Sidewall loss 132 (nm) | | Sidewall loss 150 (nm) | |
|---|---|---|---|---|
| | Center | Edge | Center | Edge |
| a | 22.5 | 23.5 | 20.0 | 30.0 |
| b | 16.5 | 20.5 | 15.5 | 22.0 |
| c | 28.5 | 31.5 | 28.0 | 30.0 |
| d | 12.0 | 18.0 | 10.0 | 9.0 |

FIG. 7 shows a plasma processing system according to an embodiment of the present invention. The plasma processing system 1 is configured to facilitate the generation of plasma in processing region 45 of the process chamber 10. The plasma processing system 1 further comprises a substrate holder 20, upon which a substrate 25 to be processed is affixed and makes electrical contact to, and a gas injection system 40 for introducing process gas 42 to the plasma process chamber 10, and a vacuum pumping system 50. The gas injection system 40 allows independent control over the delivery of the process gas 42 to the process chamber 10 from ex-situ gas sources.

An ionizable process gas 42 is introduced via the gas injection system 40 and the process pressure is adjusted. The flow rate of the process gas can be between about 10 sccm and about 5000 sccm, alternately between about 20 sccm and about 1000 sccm, and still alternately between about 50 sccm and about 500 sccm. The chamber pressure can, for example, be between about 1 mTorr and about 200 mTorr, alternately between about 5 mTorr and about 100 mTorr, still alternately between about 10 mTorr and about 50 mTorr. The controller 55 can be used to control the vacuum pumping system 50 and gas injection system 40. Substrate 25 is transferred into process chamber 10 through a slot valve (not shown) and chamber feed-through (not shown) via a (robotic) substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers are included in the substrate holder 20.

The plasma processing system 1 of FIG. 7 includes a RF plasma source that contains an upper plate electrode 70 to which RF power is coupled from a RF generator 72 through an impedance match network 74. A typical frequency for the application of RF power to the upper plate electrode 70 can range from 10 MHz to 200 MHz and can be 60 MHz. The RF power applied to the upper plate electrode 70 can be between about 500 Watts (W) and about 2200 W. As noted above, the plasma processing system 1 of FIG. 7 further includes a RF source for applying RF power to the substrate holder 20 to bias the substrate 25. The RF source contains a RF generator 30 and an impedance match network 32 that serves to maximize the transfer of RF power to plasma to the processing region 45 by minimizing the reflected power. Match network topologies (e.g., L-type, π-type, T-type) and automatic control methods are known in the art. A typical frequency for the application of power to the substrate holder 20 ranges from 0.1 MHz to 30 MHz and can be 2 MHz. The RF power applied to the substrate holder 20 can be between about 0 W and about 1000 W. Moreover, the controller 55 is coupled to the RF generator 72 and the impedance match network 74 in order to control the application of RF power to the upper plate electrode 70. In an alternate embodiment, RF power can be applied to the substrate holder 20 at multiple frequencies.

With continuing reference to FIG. 7, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate. In one embodiment, the multi-orifice showerhead gas injection plate can be the upper plate electrode 70.

Vacuum pump system 50 can include a turbo-molecular vacuum pump (TMP) capable of a pumping speed up to 5000 liters per second (and greater), and a gate valve for throttling the chamber pressure. In conventional plasma processing devices utilized for dry plasma etch, a 1000 to 3000 liter per second TMP is employed. TMPs are useful for low pressure processing, typically less than 50 mTorr. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the plasma processing system 1 as well as monitor outputs from the plasma processing system 1. Moreover, the controller 55 is coupled to and exchanges information with the RF generator 30, the impedance match network 32, the RF generator 72, the impedance match network 74, the gas injection system 40, plasma monitor system 57, and the vacuum pump system 50. A program stored in the memory is utilized to control the aforementioned components of a plasma processing system 1 according to a stored process recipe. One example of controller 55 is a digital signal processor (DSP); model number TMS320, available from Texas Instruments, Dallas, Tex.

The plasma monitor system 57 can comprise, for example, an optical emission spectroscopy (OES) system to measure excited particles in the plasma environment and/or a plasma diagnostic system, such as a Langmuir probe, for measuring plasma density. The plasma monitor system 57 can be used with controller 55 to determine the status of the etching process and provide feedback to ensure process compliance. Alternately, plasma monitor system 57 can comprise a microwave and/or a RF diagnostic system.

Figure 8:
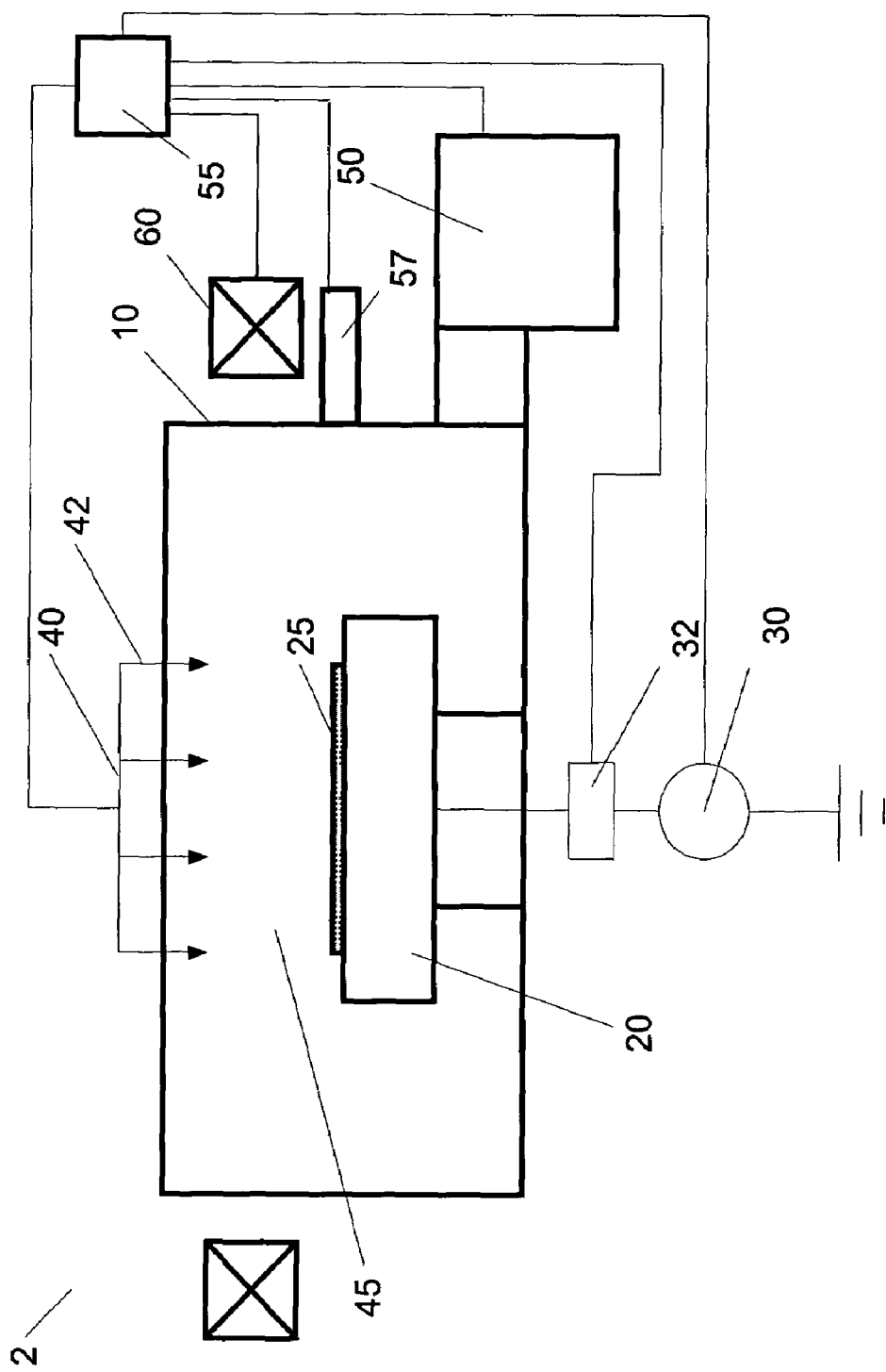
FIG. 8 shows a plasma processing system according to another embodiment of the present invention.

FIG. 8 shows a plasma processing system according to another embodiment of the present invention. The plasma processing system 2 includes a RF plasma source comprising either a mechanically or electrically rotating DC magnetic field system 60, in order to potentially increase plasma density and/or improve plasma processing uniformity. Moreover, the controller 55 is coupled to the rotating magnetic field system 60 in order to regulate the speed of rotation and field strength.

Figure 9:
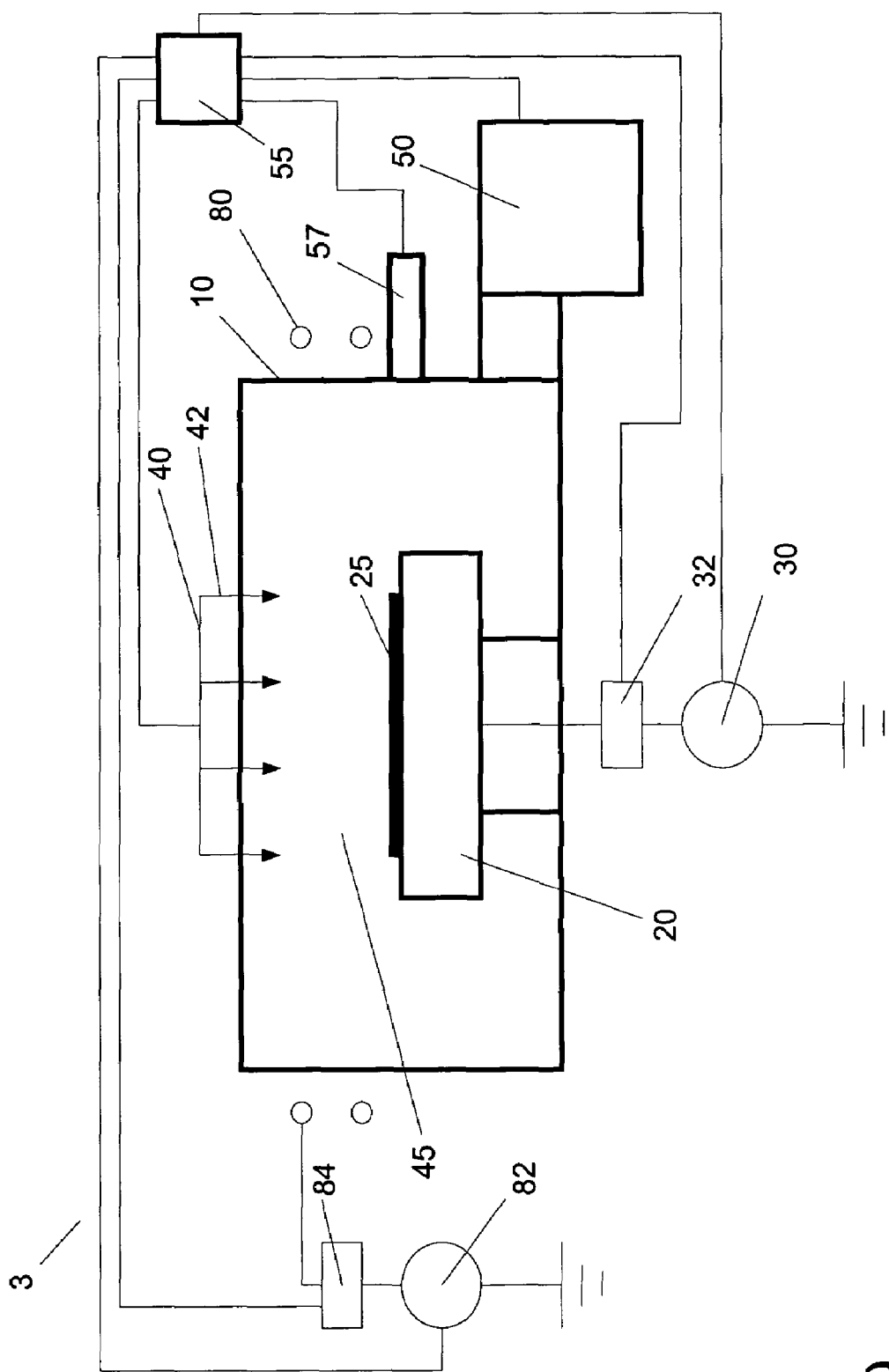
FIG. 9 shows a plasma processing system according to yet another embodiment of the present invention.

FIG. 9 shows a plasma processing system according to yet another embodiment of the present invention. The plasma processing system 3 includes a RF plasma source comprising an inductive coil 80 to which RF power is coupled via a RF generator 82 through an impedance match network 84. RF power is inductively coupled from the inductive coil 80 through a dielectric window (not shown) to the plasma-processing region 45. A typical frequency for the application of RF power to the inductive coil 80 ranges from 0.1 MHz to 100 MHz and can be 13.56 MHz. The RF power applied to the inductive coil can be between about 50 W and about 10000 W. Similarly, a typical frequency for the application of power to the chuck electrode ranges from 0.1 MHz to 30 MHz and can be 13.56 MHz. The RF power applied to the substrate holder can be between about 0 W and about 1000 W. In addition, a slotted Faraday shield (not shown) can be employed to reduce capacitive coupling between the inductive coil 80 and plasma. Moreover, the controller 55 is coupled to the RF generator 82 and the impedance match network 84 in order to control the application of power to the inductive coil 80.

In addition, it is to be understood that the plasma processing systems depicted in FIGS. 7-9 are shown for exemplary purposes only, as many variations of the specific hardware can be used to implement processing systems in which the present invention may be practiced, and these variations will be readily apparent to one having ordinary skill in the art.

Numerous modifications and variations of the present invention are possible in light of the above teachings. It is therefore to be understood that, within the scope of the appended claims, the invention may be practiced otherwise than as specifically described herein.

What is claimed is:

1. A method of in-situ ashing, comprising:
introducing a process gas containing an oxygen-containing gas;
generating a plasma in a plasma processing chamber;
exposing a substrate to the plasma, the substrate residing on top of a substrate holder;
performing a first ashing step by applying a first bias to the substrate holder; and
performing a second ashing step by applying a second bias to the substrate holder, wherein the second bias is greater than the first bias and the chamber pressure in the second ashing step is less than 20 mTorr.

2. The method according to claim 1, wherein the oxygen-containing gas comprises $O_2$.

3. The method according to claim 1, wherein the process gas further comprises an inert gas.

4. The method according to claim 3, wherein the inert gas comprises a noble gas, $N_2$, or a combination thereof.

5. The method according to claim 1, wherein the first bias is between about 0 W and about 100 W.

6. The method according to claim 1, wherein the first bias is substantially equal to zero.

7. The method according to claim 1, wherein the second bias is between about 50 W and about 1000 W.

8. The method according to claim 1, wherein the second ashing step further comprises utilizing in the second ashing step at least one of chamber pressure, and rate of process gas flow different from the first ashing step.

9. The method according to claim 1, wherein the first ashing step further comprises:
detecting emitted light from the plasma; and
determining the status of the first ashing step from the emitted light.

10. The method according to claim 9, wherein the detection of the emitted light provides means for establishing an endpoint.

11. The method according to claim 9, wherein the emitted light originates from an excited species and represents information on the status of the first ashing step.

12. The method according to claim 9, wherein the emitted light originates from at least one of CO and a fluorine-containing species.

13. The method according to claim 12, wherein the fluorine-containing species is fluorine.

14. The method according to claim 1, wherein the second ashing step further comprises:
detecting emitted light from the plasma; and
determining the status of the second ashing step from the emitted light.

15. The method according to claim 14, wherein the emitted light originates from an excited species and represents information on the status of the second ashing step.

16. The method according to claim 15, wherein the emitted light originates from at least one of CO and a fluorine-containing species.

17. The method according to claim 16, wherein the fluorine-containing species is fluorine.

18. The method according to claim 1, further comprising:
    detecting emitted light from the plasma; and
    determining a status of the first and second ashing steps from the emitted light.

19. The method according to claim 18, wherein the emitted light originates from an excited species and represents information on the status of the first and second ashing steps.

20. The method according to claim 18, wherein the emitted light originates from at least one of CO and a fluorine-containing species.

21. The method according to claim 20, wherein the fluorine-containing species is fluorine.

22. The method according to claim 1, wherein the length of the second ashing step is between 50% and 200% of the length of the first ashing step.

23. The method according to claim 1, wherein flow rate of the process gas is between 5 sccm and 1500 sccm.

24. The method according to claim 1, wherein flow rate of the oxygen-containing gas is between 5 sccm and 500 sccm.

25. The method according to claim 2, wherein flow rate of $O_2$ is between 5 sccm and 500 sccm.

26. The method according to claim 1, wherein flow rate of the process gas in the first ashing step is between 5 sccm and 1500 sccm.

27. The method according to claim 1, wherein the flow rate of the process gas in the second ashing step is between 5 sccm and 1500 sccm.

28. The method according to claim 1, wherein the flowrate of the process gas is varied between the first and second ashing steps.

29. The method according to claim 1, wherein pressure in the processing chamber in the first ashing step is between about 1 mTorr and about 1000 mTorr.

30. The method according to claim 1, wherein pressure in the processing chamber in the first ashing step is between about 5 mTorr and about 50 mTorr.

31. The method according to claim 1, wherein the pressure in the processing chamber in the second ashing step is less than about 10 mTorr.

32. The method according to claim 1, wherein the pressure in the processing chamber in the second ashing step is less than about 5 mTorr.

33. The method according to claim 1, wherein the pressure in the processing chamber is varied between the first and second ashing steps.

34. The method according to claim 1, wherein the substrate comprises a low-k material, a photoresist, or etch residues, or a combination thereof.

35. The method according to claim 34, wherein the low-k material comprises a SiOC material.

36. The method according to claim 1, wherein the generating comprises applying RF power through an impedance match network to an upper plate electrode of a plasma source.

37. The method according to claim 36, wherein the RF power applied to the upper plate electrode is between about 500 W and about 2200 W.

38. The method according to claim 1, wherein the generating comprises applying RF power through an impedance match network to an inductive coil of a plasma source.

39. The method according to claim 38, wherein the RF power applied to the inductive coil is between about 50 W and about 10000 W.

40. The method according to claim 1, wherein the generating comprises applying RF power to a rotating DC magnetic field power source.

41. A method of in-situ ashing, comprising:
    introducing a process gas containing $O_2$ gas;
    generating a plasma in a plasma processing chamber by applying RF power through an impedance match network to an upper plate of a plasma source;
    exposing a substrate to the plasma, the substrate containing a low-k material, photoresist, or etch residues, or a combination thereof, and residing on top of a substrate holder;
    performing a first ashing step by applying a first bias between about 0 W and about 100 W to the substrate holder; and
    performing a second ashing step by applying a second bias between about 50 W and about 1000 W to the substrate holder, wherein the second bias being greater than the first bias and the chamber pressure in the second ashing step being less than 20 mTorr.

42. The method according to claim 41, wherein the process gas further comprises a noble gas.

43. The method according to claim 41, wherein the RF power applied to the upper plate electrode is between about 500 W and about 2200 W.

44. The method according to claim 1, wherein the first ashing step is an initial ashing step performed after the exposing step.

45. The method according to claim 41, wherein the first ashing step is an initial ashing step performed after the exposing step.

* * * * *